(12) United States Patent
Aarts

(10) Patent No.: US 6,456,718 B1
(45) Date of Patent: Sep. 24, 2002

(54) AUDIO SYSTEM

(75) Inventor: Ronaldus M. Aarts, Eindhoven (NL)

(73) Assignee: US Philips Corporation, New York, NY (US)

( * ) Notice: Subject to any disclaimer, the term of this patent is extended or adjusted under 35 U.S.C. 154(b) by 0 days.

(21) Appl. No.: 09/175,248

(22) Filed: Oct. 20, 1998

Related U.S. Application Data

(62) Division of application No. 08/851,302, filed on May 5, 1997.

(30) Foreign Application Priority Data

Nov. 7, 1997 (EP) .............................................. 97203441

(51) Int. Cl.[7] .................................................. H03G 3/00
(52) U.S. Cl. ............................. 381/61; 381/98; 84/660; 84/625
(58) Field of Search .............................. 381/61, 98, 96, 381/59; 84/660, 661, 669, 625, 697, 698, 699, 700

(56) References Cited

U.S. PATENT DOCUMENTS

| 5,032,796 A | | 7/1991 | Tiers et al. | |
| 5,388,159 A | * | 2/1995 | Sakata | .......................... 381/98 |
| 5,771,296 A | * | 6/1998 | Unemura | ...................... 381/61 |

FOREIGN PATENT DOCUMENTS

| EP | 0647023 A2 | 4/1995 | ........... H03H/11/04 |

* cited by examiner

*Primary Examiner*—Minsun Oh Harvey
(74) *Attorney, Agent, or Firm*—Edward W. Goodman

(57) ABSTRACT

An audio system includes a circuit (12) for processing an audio signal, this circuit (12) having an input (20) for receiving the audio signal and an output (26) for supplying an output signal. The circuit (12) further includes a harmonics generator (22) coupled to the input (20) for generating harmonics of the audio signal, and an adding circuit (24) coupled to the input (20) as well as to the harmonics generator (22) for supplying a sum of the audio signal and the generated harmonics to the output (26). The harmonics generator (22) is embodied so as to limit the amplitude of the generated harmonics.

5 Claims, 7 Drawing Sheets

AUDIO SYSTEM

Figure 1:
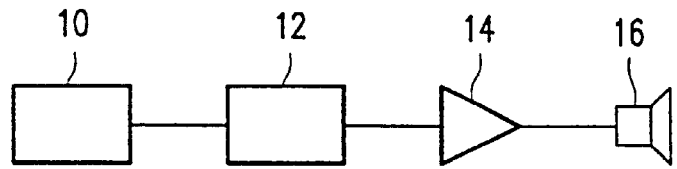

This application is a division of Ser. No. 08/851,302 filed on May 5, 1997.

The invention relates to an audio system comprising a circuit for processing an audio signal, whereby the circuit comprises an input for receiving the audio signal and an output for supplying an output signal, a harmonics generator coupled to the input for generating harmonics of the audio signal, adding means coupled to the input as well as to the harmonics generator for supplying a sum of the audio signal and the generated harmonics to the output.

The invention further relates to a circuit for processing an audio signal, a harmonics generator and a method for processing an audio signal.

An audio system according to the preamble is known from EP-A 546 619. Since the invention of the electrodynamic loudspeaker, there has been a need for greater acoustical output, especially at low frequencies. Often however, for instance in television sets or portable audio sets, this acoustical output is severely limited by the small size of the loudspeakers. It is known that this dilemma can be solved by using a psychoacoustic phenomenon often referred to as virtual pitch or missing fundamental, which evokes the illusion of a higher bass-response, while the loudspeaker does not radiate more power at those low frequencies. This illusion can be created by replacing low-frequency tones, which are present in the audio signal but cannot be reproduced by a small loudspeaker, by harmonics of these tones. The harmonics now represent the low-frequency tones.

In the known audio system a low-frequency band of an audio signal is selected and supplied to a harmonics generator for generating harmonics of the selected signal. The generated harmonics are thereafter added to the audio signal. In this way the low-frequency perception of the audio signal is improved. In the known audio system a full-wave rectifier is used as the harmonics generator, which generates only even harmonics. Some low-frequency tones, which are reproduced by the known audio system, are perceived by human beings as having a higher loudness than the loudness of the corresponding low-frequency tones which are present in the audio signal.

An object of the invention is to provide an audio system, wherein the perceived loudness of low-frequency tones is substantially equal to the received loudness of the corresponding low-frequency tones in the original audio signal. This object is achieved in the audio system according to the invention, which is characterized in that the harmonics generator is embodied so as to limit the amplitude of the generated harmonics. Experiments have shown that, by this measure, the perceived loudness of low-frequency tones can be controlled accurately, thus allowing this perceived loudness to be substantially equal to the received loudness of the corresponding low-frequency tones in the original audio signal.

An embodiment of the audio system according to the invention is characterized in that the harmonics generator is embodied so as to fix the amplitude of the generated harmonics when the amplitude crosses a threshold value. In this way, this embodiment incorporates a simple and advantageous realisation of the desired limitation of the amplitude of the generated harmonics.

A further embodiment of the audio system according to the invention is characterized in that the harmonics generator comprises a rectifier for rectifying the audio signal. This measure enables the harmonics to be generated in a simple and effective way.

Figure 2:
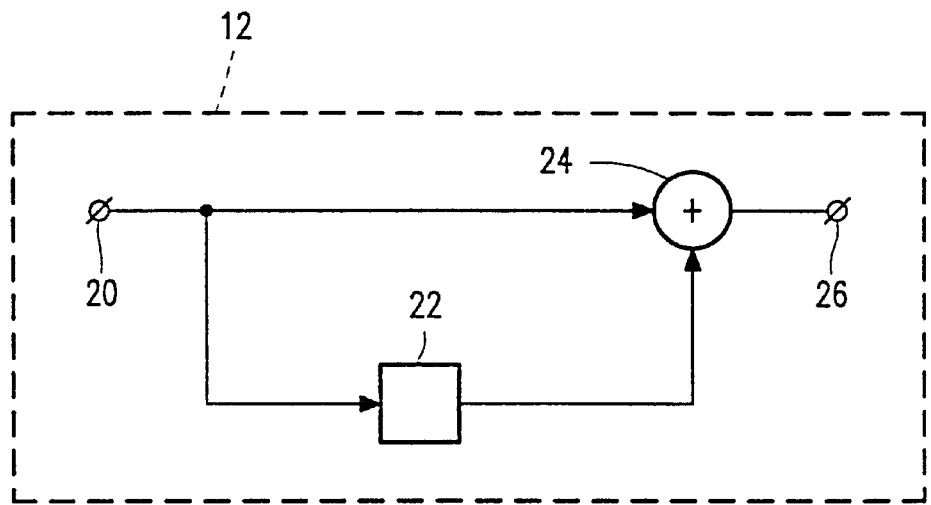
Figure 3:
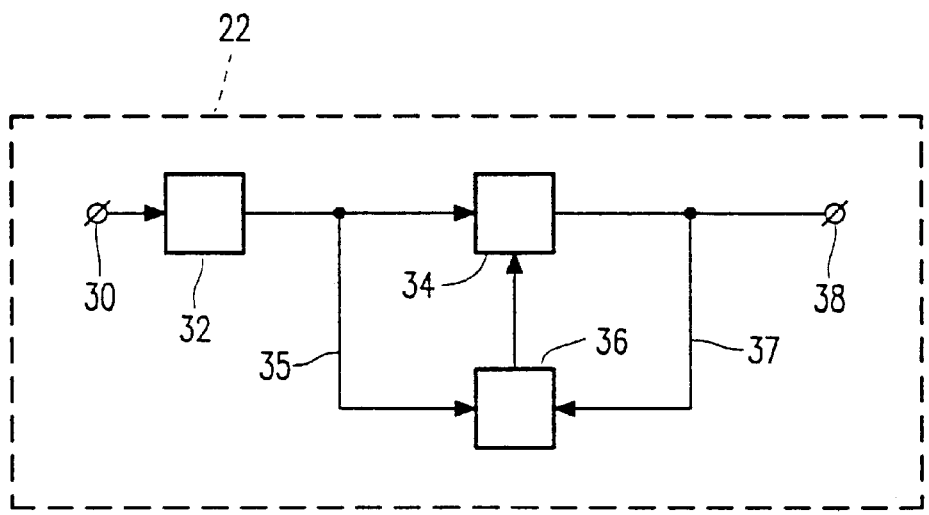
Figure 4:
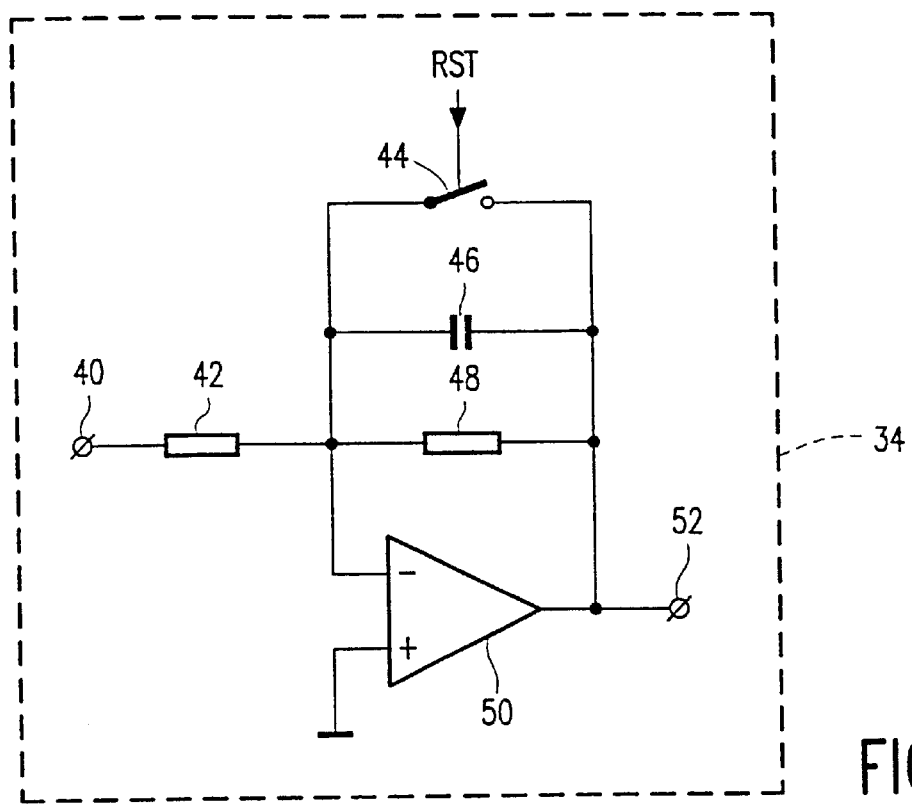
Figure 5:
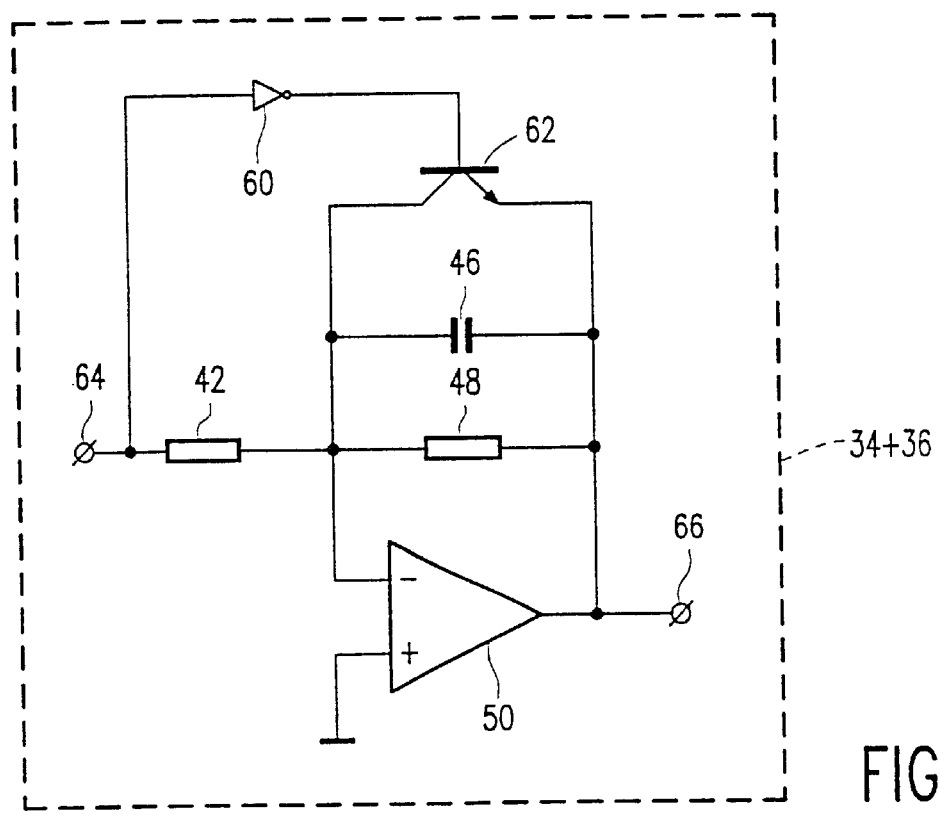
Figure 6:
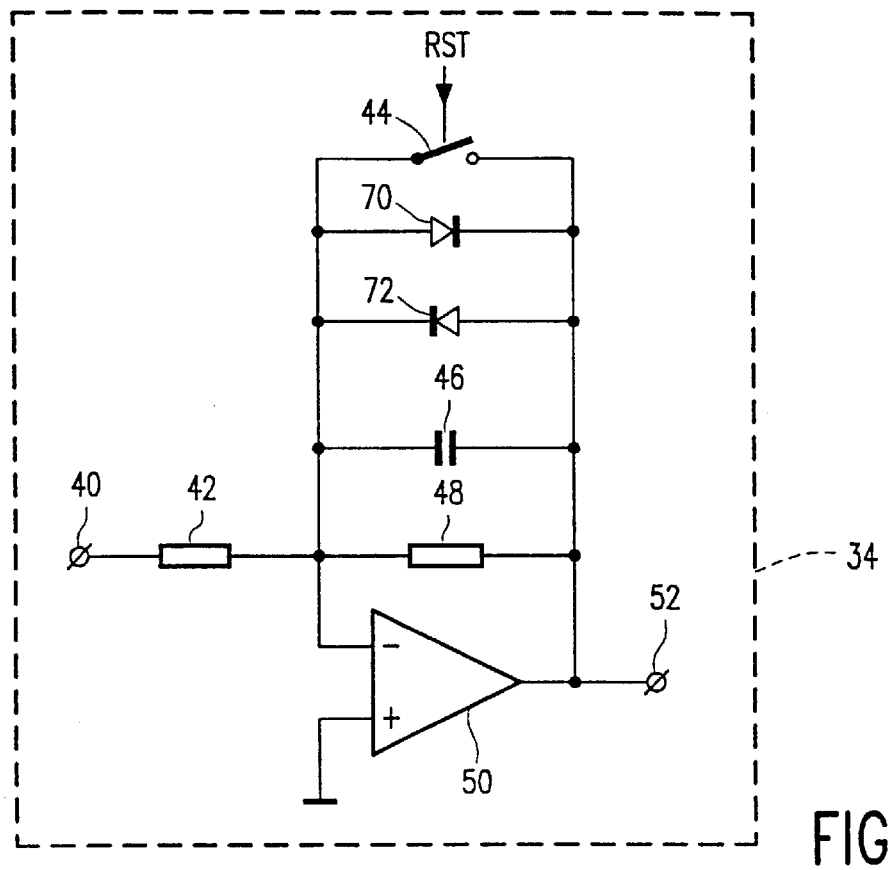
Figure 7:
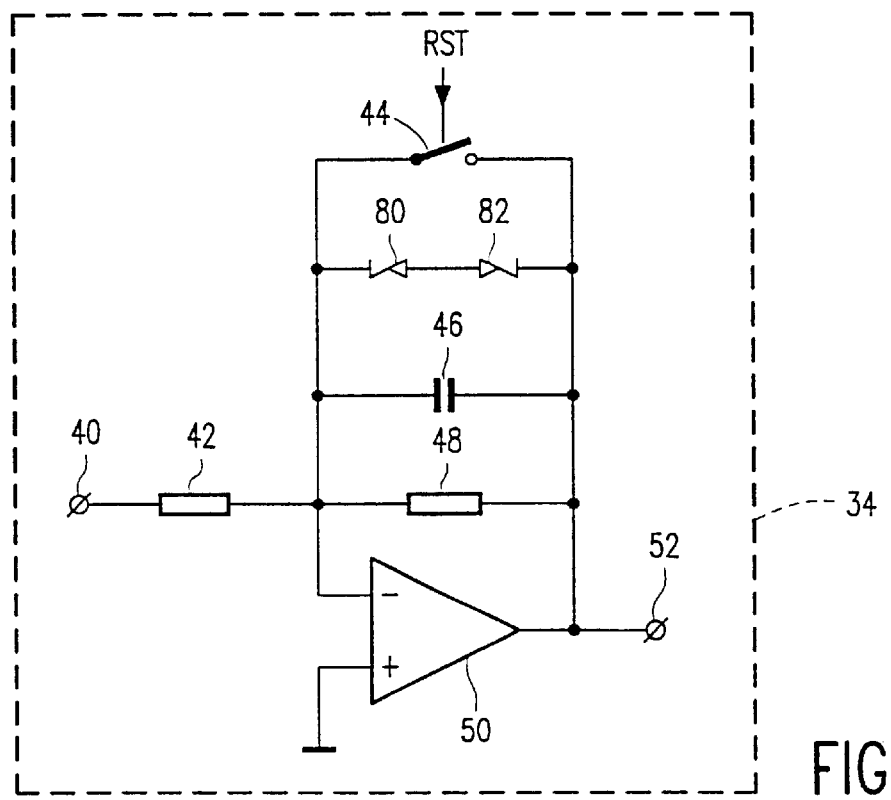
Figure 8:
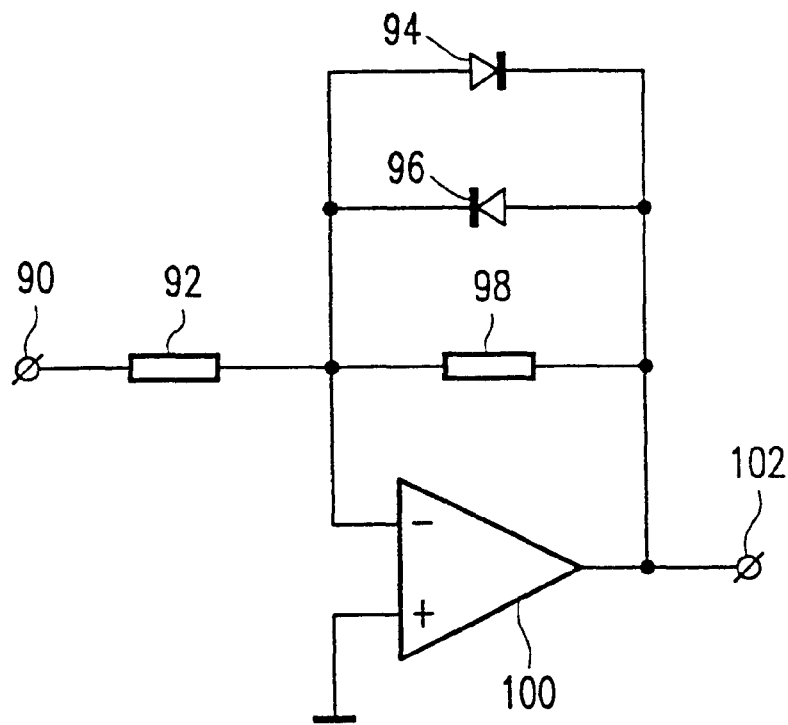
Figure 9:
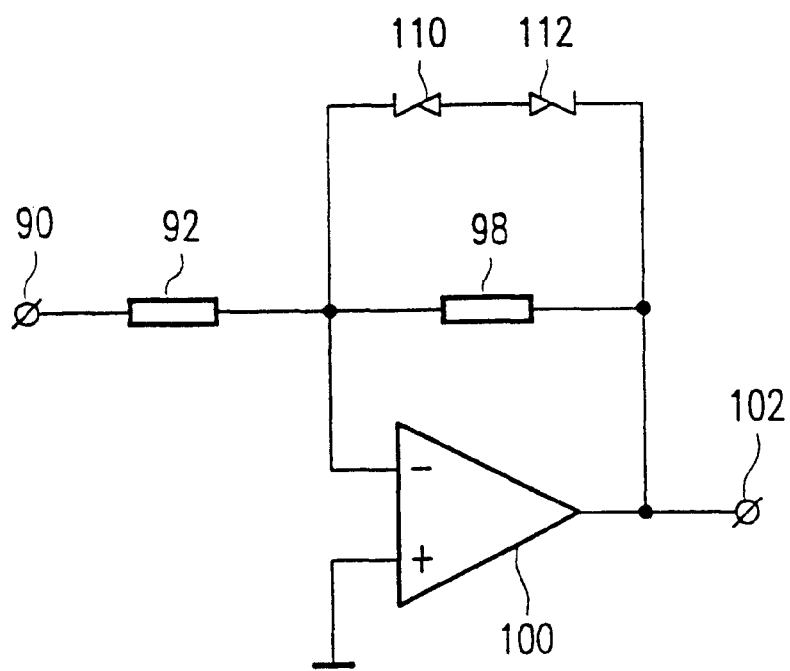
Figure 10A:
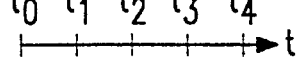
Figure 10A:
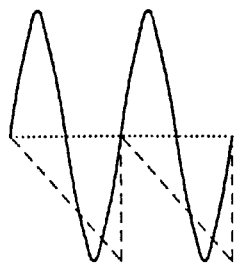
Figure 10B:
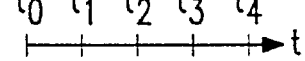
Figure 10B:
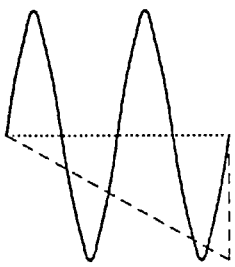
Figure 10C:
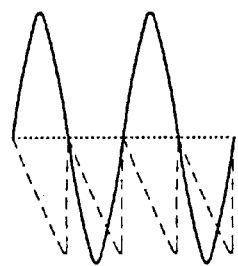
Figure 10D:
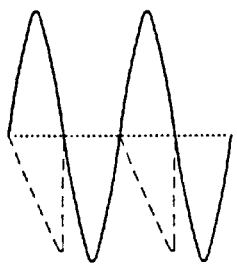
Figure 10E:
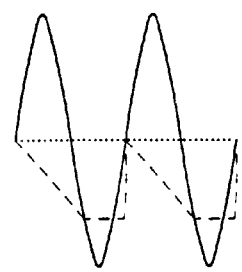
Figure 10F:
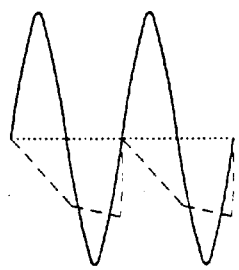
Figure 10G:
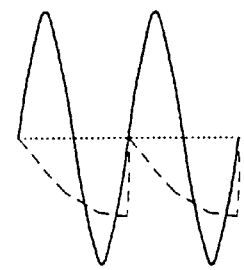

The above object and features of the present invention will be more apparent from the following description of the preferred embodiments with reference to the drawings, wherein:

FIG. 1 shows a block diagram of an audio system according to the invention,

FIG. 2 shows a block diagram of a circuit for processing an audio signal according to the invention, FIG. 3 shows a block diagram of a harmonics generator for use in the present invention, FIG. 4 shows a first embodiment of an integrator which can be used in the present invention, FIG. 5 shows a circuit for use in the present invention, in which an integrator and a resetting means are combined, FIGS. 6 and 7 show second and third embodiments, respectively, of an integrator for use in the present invention, FIGS. 8 and 9 show first and second embodiments, respectively, of a limiter which can be used in the present invention, FIG. 10 shows diagrams of various wave forms a..g generated in response to a sinusoidal input signal applied to a harmonics generator for use in the present invention.

Figure 11:
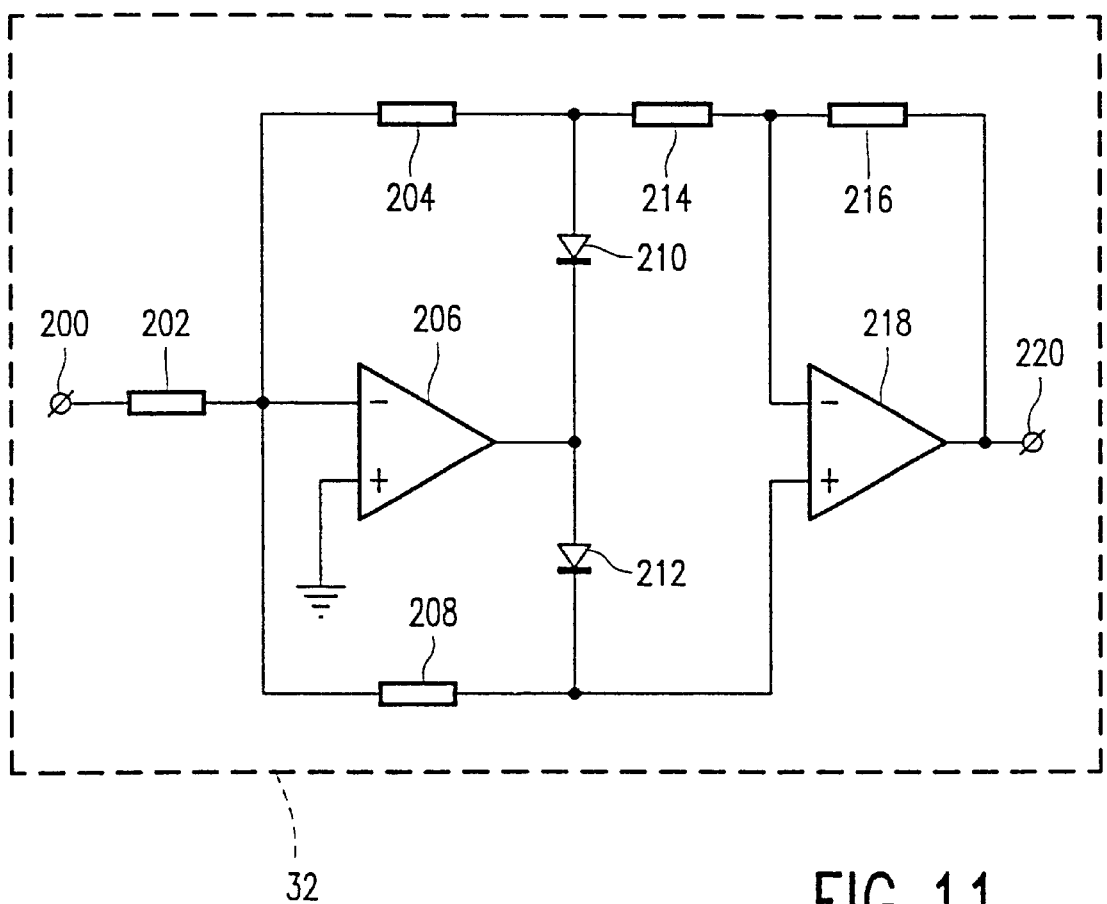
Figure 12:
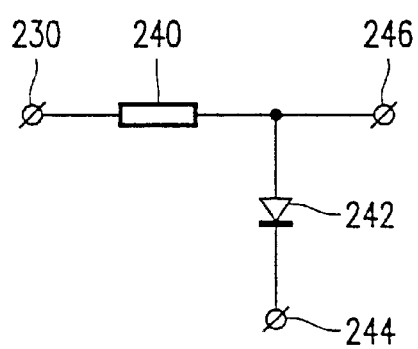
Figure 13A:
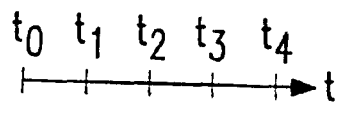
Figure 13A:
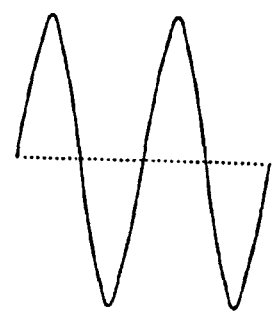
Figure 13B:
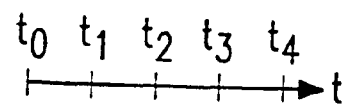
Figure 13B:
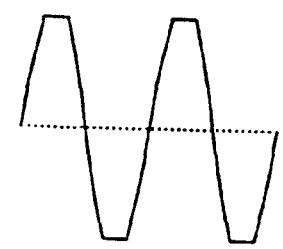
Figure 13C:
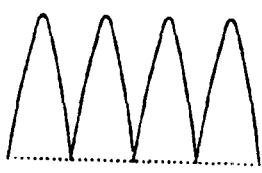
Figure 13D:

FIG. 11 shows an embodiment of a rectifier for use in an harmonics generator according to the invention, FIG. 12 shows a third embodiment of a limiter for use in the present invention, FIG. 13 shows diagrams of various wave forms b..d generated in response to a sinusoidal input signal applied to a harmonics generator according to the invention. In the figures, identical parts are provided with the same reference numbers.

FIG. 1 shows a block diagram of an audio system according to the invention. The audio system comprises a signal source 10, which is coupled via a circuit 12 and an amplifier 14, respectively, to a loudspeaker 16. The signal source 10 may derive its signal from a CD, a cassette or a received signal or any other audio source. The circuit 12 processes the audio signal supplied by the signal source 10 in such a way that low-frequency tones, which are present in the audio signal but cannot be reproduced by the loudspeaker 16 because of its limited size, are replaced by harmonics of these tones. These harmonics, which can be reproduced by the loudspeaker 16, evoke the illusion of a higher bass response. This psychoacoustical phenomenon is often referred to as virtual pitch or missing fundamental. The audio signal, which is processed by the circuit 12, is thereafter amplified by the amplifier 14. This amplified signal is then reproduced by the loudspeaker 16.

FIG. 2 shows a block diagram of a circuit 12 for processing an audio signal according to the invention. The circuit 12 comprises an input 20 for receiving an audio signal and an output 26 for supplying an output signal. The circuit 12 further comprises a harmonics generator 22 coupled to the input 20 and adding means 24, coupled to the input 20 and the harmonics generator 22, for supplying the sum of the audio signal and the output signal of the harmonics generator 22 to the output 26.

In the circuit 12 for processing an audio signal a first filter may be inserted between the input 20 and the harmonics generator 22. Preferably this first filter is embodied so as to pass those low-frequency components in the audio signal which cannot be reproduced by the loudspeaker 16, while at the same time spurious dc components in the audio signal are blocked. It is also possible to insert a second filter in the circuit 12 between the harmonics generator 22 and the adding means 24. By means of this second filter the number of harmonics which are reproduced by the loudspeaker 16 can be controlled. Furthermore, a third filter can be inserted in the circuit 12 between the input 20 and the adding means 24. Preferably, this third filter is used to block those low-frequency components in the audio signal which cannot be reproduced by the loudspeaker, thus preventing an overload of the loudspeaker 16.

FIG. 3 shows a block diagram of a harmonics generator 22 for use in the present invention. The harmonics generator 22 comprises an input 30 for receiving an audio signal and an output 38 for supplying an output signal. The harmonics generator 22 further comprises an integrator 34 and, coupled thereto, a resetting means 36. The integrator 34 integrates the audio signal received by the input 30 and supplies the integrated signal to the output 38. The resetting means 36 are embodied so as to reset the integrator 34 at resetting times. In this way, the output signal comprises both odd and even harmonics, whereby the amplitudes of these harmonics are substantially equal to each other. Furthermore, because the amplitude of the generated harmonics is proportional to the amplitude of the audio signal, no annoying distortions are introduced by the harmonics generator 22.

The resetting times can be determined by the resetting means 36 in a number of different ways. The resetting means 36 can determine the resetting times in dependence on some properties of the audio signal, for instance the period, the amplitude or the zero crossings. It is also possible that the resetting means 36 determine the resetting times in dependence on similar properties of the output signal. Furthermore, the resetting means 36 may determine the resetting times in dependence on both the audio signal and the output signal. It may be clear that in a specific embodiment of the harmonics generator 22 according to the invention, only one or both of the connections 35 and 37 are present.

The harmonics generator 22 may further comprise a rectifier 32, which rectifies the audio signal received by the input 30. The rectified signal can then be integrated by the integrator 34. In an alternative embodiment of the harmonics generator 22, the harmonics generator 22 comprises only the rectifier 32, i.e. the integrator 34 and the resetting means 36 are omitted in this case.

FIG. 4 shows a first embodiment of an integrator 34 which can be used in the present invention. The integrator 34 comprises an input 40 for receiving an input signal and an output 52 for supplying an output signal. The integrator 34 further comprises an operational amplifier 50, the positive input of which is grounded. A resistor 48, a capacitor 46 and a switch 44 are placed in parallel with each other and couple the negative input of the operational amplifier 50 to its output. This negative input of the operational amplifier 50 is also coupled, via a resistor 42, to the input 40. The output of the operational amplifier 50 is coupled to the output 52 of the integrator 34. The switch 44 is controlled by the reset signal RST, which is generated by the resetting means 36 in such a way that the switch 44 is closed at resetting times.

It will be clear to a person skilled in the art that the input signal received at the input 40 is integrated by this embodiment of the integrator 34, whereby the integrated signal is supplied to the output 52. The integrator is reset, i.e. the capacitor 46 is discharged and the output signal is reset to zero, when the switch 44 is closed.

FIG. 5 shows a circuit for use in the present invention, in which an integrator 34 and a resetting means 36 are combined. This circuit comprises an input 64 for receiving an input signal and an output 66 for supplying an output signal. The circuit further comprises the elements of FIG. 4 which are needed for the integration of the input signal, i.e. the resistors 42 and 48, the operational amplifier 50 and the capacitor 46. The switch 44 is implemented by means of the transistor 62. Because the base of this transistor 62 is coupled via an inverter 60 to the input 64, the transistor 62 conducts (i.e. the switch 44 is closed and the integrator is reset) when the input signal is negative. On the other hand, when the input signal is positive, the transistor 62 does not conduct, i.e. the switch 44 is open.

Some low-frequency tones, which are reproduced by the audio system according to the invention, are perceived by human beings as having a higher loudness than the loudness of the corresponding low-frequency tones which are present in the audio signal. In order to compensate for this undesired artefact, the integrator 34 can be embodied so as to limit the amplitude of the integrated signal. In this way, the perceived loudness of low-frequency tones can be controlled, preferably in such a manner that the perceived loudness is substantially equal to the original loudness.

FIGS. 8 and 9 show first and second embodiments, respectively, of a limiter which can be used to limit the range of the output signal of an integrator 34 as shown, for example, in FIGS. 4 and 5. In FIGS. 8 and 9 the limiter comprises an inverting amplifier, which is comprised of an input 90, an output 102, an operational amplifier 100 and two resistors 92 and 98. The absolute value of the voltage gain of this inverting amplifier is equal to the resistance of the resistor 98 divided by the resistance of the resistor 92. In the limiter of FIG. 8, two diodes 94 and 96, which are placed in parallel with the resistor 98, prevent an output signal of the inverting amplifier from exceeding certain voltage limits. Because the positive input of the operational amplifier 100 is grounded, the voltage at the negative input is also zero (virtual ground). Thus, diode 94 conducts when the output signal is negative, i.e. when the input signal which is received by the input 90 is positive. In the same way, diode 96 conducts when the output signal is positive, i.e. when the input signal is negative. In this way, when using silicon diodes, the range of the output signal is limited between approximately −0.6 and +0.6 volts.

In the limiter of FIG. 9, the task of preventing the output signal of the inverting amplifier from exceeding certain voltage limits is performed by two zener diodes 110 and 112. Here, the zener diode 110 conducts when the output signal is positive, and the zener diode 112 conducts when the output signal is negative. In this way, the range of the output signal is limited between approximately the inverted zener voltage of the zener diode 110 and the zener voltage of the zener diode 112.

The limiters as shown in FIGS. 8 and 9 can be coupled to the integrator 34 as shown, for example, in FIG. 4. This coupling may for instance be effected in such a way that the output 52 of the integrator 34 is connected to the input 90 of the limiter, thus providing for a limitation of the output signal of the integrator 34. It is also possible to couple the output 102 of the limiter to the input 40 of the integrator 34, thus providing for a limitation of the input signal of the integrator 34. Furthermore, it is possible to combine the function of the limiter with that of the integrator 34. Two examples of such a combination are shown in FIGS. 6 and 7. FIG. 6 shows the combination of the limiter of FIG. 8 with the integrator 34 as shown in FIG. 4. The combination of the limiter of FIG. 9 with the integrator 34 as shown in FIG. 4 is depicted in FIG. 7.

The integrator 34 as shown, for example, in FIG. 4 may also be embodied so as to adapt an integration time-constant in dependence on the amplitude of the integrated signal. By virtue of this measure, the amplitude of the integrated signal can be limited gradually, thus enabling a smooth control of the perceived loudness of low-frequency tones. This adaptation of the integration time-constant can be achieved by altering the resistance of the resistor 42 and/or the capacitance of the capacitor 46. The effective resistance of the resistor 42 can be changed, for instance, by switching one or more resistors in series or in parallel with the resistor 42. The effective capacitance of the capacitor 46 can be changed, for instance, by switching one or more capacitors in series or in parallel with the capacitor 46.

FIG. 10 shows styled diagrams of various wave forms a..g generated in response to a sinusoidal input signal applied to a harmonics generator 22 according to the invention. In these diagrams the input signal is indicated by a straight line and the generated wave form is indicated by means of a dashed line. The wave form a in FIG. 10 can be generated by the harmonics generator 22 according to the invention, in which the input signal is rectified before being integrated, whereby the integrator 34 is reset by the resetting means 36 at the end of each period of the input signal; The wave forms b and c can be generated by the harmonics generator 22 in a similar fashion, whereby, for wave form b, the integrator 34 is reset at the end of each second period of the input signal, and for wave form c, the integrator 34 is reset at each zero crossing of the input signal. The wave form d can be generated by the harmonics generator 22, whereby the harmonics generator 22 comprises the combination of the integrator 34 and the resetting means 36 as depicted in FIG. 5. In this case, the harmonics generator 22 does not comprise the rectifier 22.

Wave forms e, f, and g in FIG. 10 can be generated by the harmonics generator 22 according to the invention in a similar fashion as described above for wave form a. Wave form e is generated by the harmonics generator 22, which is embodied so as to stop the integration in dependence on the amplitude of the integrated signal. Here, the harmonics generator 22 may comprise an integrator 34 as shown in FIGS. 6 and 7, or an integrator 34 as depicted in FIG. 4 in combination with a limiter circuit as shown, for example, in FIGS. 8 and 9.

The wave forms f and g illustrate the adaptation of an integration time-constant by the integrator 34. In order to generate the wave form f, the integration time-constant of the integrator 34 is adapted once during each period of the input signal, whereby this adaptation depends on, for example, the amplitude or the frequency of the integrated signal. Waveform g may be generated in a similar fashion, whereby the integrator 34 is adapted twice during each period of the input signal. Of course it is also possible to arrange the integrator 34 in such a way that more than two adaptations of the integration time-constant are supported.

FIG. 11 shows an embodiment of a full-wave rectifier for use in an harmonics generator according to the invention. This embodiment, which is well known in the art, comprises an input 200 for receiving an input signal and an output 220 for supplying an output signal. This embodiment further comprises five resistors 202, 204, 208, 214 and 216, two diodes 210 and 212, and two operational amplifiers 206 and 218. When the input signal is positive, the diode 210 conducts and the diode 212 does not conduct, resulting in a positive output signal. When the input signal is negative, the diode 210 does not conduct and the diode 212 conducts, resulting also in a positive output signal. For any input signal, the output signal is proportional to the absolute value of the input signal.

FIG. 12 shows a third embodiment of a limiter for use in the present invention. This circuit, which is well known and often referred to as diode clamp, comprises an input 230 for receiving an input signal, an output 246 for supplying an output signal, a reference connection 244 for providing a reference voltage $V_{ref}$, a resistor 240 and a diode 242. In this circuit the diode 242 prevents the amplitude of the output signal from exceeding a voltage limit which is approximately equal to $V_{ref}+0.6$ volts. It will be clear to a skilled person that this embodiment of a limiter can be used in the harmonics generator 22 according to the invention in a number of different ways. For example, the input 230 of the diode clamp can be connected to the output 220 of the rectifier 32 or to the output 52 of the integrator 34, thus providing for a limitation of the output signal. It is also possible to couple the output 246 of the diode clamp to the input 200 of the rectifier 32 or to the input 40 of the integrator 34, thus providing for a limitation of the input signal.

The limiter as shown in FIG. 12 may be coupled to the integrator 34 as shown, for example, in FIG. 4. This coupling may for instance be effected in such a way that the output 52 of the integrator 34 is connected to the input 90 of the limiter, thus providing for a limitation of the output signal of the integrator 34. It is also possible to couple the output 102 of the limiter to the input 40 of the integrator 34, thus providing for a limitation of the input signal of the integrator 34.

FIG. 13 shows diagrams of various wave forms b..d generated in response to a sinusoidal input signal applied to a harmonics generator according to the invention. In diagram a of FIG. 13 this input signal is depicted. The wave form b in FIG. 13 can be generated by the harmonics generator 22 according to the invention, whereby the amplitude of the generated wave form b is limited. The wave form c can be generated by a harmonics generator 22 comprising a rectifier 32. The wave form d in FIG. 13 can be generated by the harmonics generator 22 according to the invention, in which the input signal is rectified before being integrated, and the harmonics generator 22 limits the amplitude of the generated wave form d.

It will be obvious to those having ordinary skill in the art that many changes may be made to the above-described invention without departing from the underlying principles thereof. For example, the signal processing performed in the entities according to the invention may also be performed by a dedicated integrated circuit or in software running on a programmable processor. Furthermore, in the integrator 34 as shown, for example, in FIG. 4, the resistor 48 may be omitted. A desired limitation of the amplitude of the output signal of the harmonics generator 22 can also be achieved by means of a multiplication of the input or output signal with a certain multiplication factor.

What is claimed is:

1. An audio system comprising loudspeakers, and a circuit for processing an audio signal, whereby the circuit comprises:

an input for receiving the audio signal and an output for supplying an output signal;

a low-pass filter coupled to the input having a cut-off frequency at a known frequency for passing a portion of said audio signal having a frequency below said known frequency;

a harmonics generator coupled to an output of the low-pass filter for generating harmonics of the low-pass filtered audio signal; and adding means coupled to the input as well as to the harmonics generator for supplying a sum of the audio signal and the generated harmonics to the output, characterized in that the harmonics generator comprises:

a full-wave rectifier for rectifying the audio signal;

an integrator for integrating the rectified audio signal, said integrator generating the harmonics; and means for limiting an amplitude of the generated harmonics.

2. The audio system according to claim 1, characterized in that the limiting means comprises means for fixing the amplitude of the generated harmonics when the amplitude crosses a threshold value.

3. The audio system according to claim 1, characterized in that the circuit further comprises a high-pass filter having a cut-off frequency at said known frequency coupled between said harmonics generator and said adding means, for preventing a portion of said generated harmonics having a frequency below said known frequency from reaching said loudspeakers.

4. A circuit for processing an audio signal, comprising:

an input for receiving the audio signal and an output for supplying an output signal;

a low-pass filter coupled to the input having a cut-off frequency at a predetermined frequency for passing a portion of said audio signal having a frequency below said predetermined frequency;

a harmonics generator coupled to the low-pass filter for generating harmonics of the audio signal; and adding means coupled to the input as well as to the harmonics generator for supplying a sum of the audio signal and the generated harmonics to the output, characterized in that the harmonics generator comprises:

a full-wave rectifier for rectifying the low-pass filtered audio signal;

an integrator for integrating the rectified audio signal, said integrator forming the harmonics; and means for limiting an amplitude of the generated harmonics.

5. A method for processing an audio signal, said method comprising the steps:

low-pass filtering the audio signal to block frequencies above a predetermined frequency;

generating harmonics of the low-pass filtered audio signal; and forming a sum of the audio signal and the generated harmonics, characterized in that the step of generating the harmonics comprises:

full-wave rectifying the low-pass filtered audio signal;

integrating the rectified audio signal thereby forming the harmonics; and limiting an amplitude of the generated harmonics.

* * * * *